United States Patent
Choi et al.

(10) Patent No.: US 6,756,786 B2
(45) Date of Patent: Jun. 29, 2004

(54) METHOD FOR DETECTING LINE-TO-GROUND FAULT LOCATION IN POWER NETWORK

(75) Inventors: Myoen-Song Choi, Seoul (KR); Seung-Jae Lee, Seongnam-si (KR)

(73) Assignee: Myongji University, Seoul (KR)

( * ) Notice: Subject to any disclaimer, the term of this patent is extended or adjusted under 35 U.S.C. 154(b) by 23 days.

(21) Appl. No.: 10/303,822

(22) Filed: Nov. 26, 2002

(65) Prior Publication Data
US 2003/0155929 A1 Aug. 21, 2003

(30) Foreign Application Priority Data
Feb. 20, 2002 (KR) .......................................... 2002-8983

(51) Int. Cl.[7] .............................................. H01H 31/02
(52) U.S. Cl. ...................... 324/509; 324/512; 324/521; 324/522; 702/59; 702/65
(58) Field of Search ................................ 324/509, 511, 324/512, 521–528; 702/57–59, 64–67

(56) References Cited

U.S. PATENT DOCUMENTS

| | | | | |
|---|---|---|---|---|
| 4,313,169 A | * | 1/1982 | Takagi et al. ................. | 702/59 |
| 4,559,491 A | * | 12/1985 | Saha ........................... | 324/522 |
| 5,661,664 A | * | 8/1997 | Novosel et al. ............... | 700/293 |
| 6,476,613 B2 | * | 11/2002 | Saha et al. ................... | 324/522 |

OTHER PUBLICATIONS

G.B. Ancell, et al.; *Maximum Likelihood Estimation of Fault Location on Transmission Lines Using Travelling Waves*; IEEE Transactions on Power Delivery, vol. 9, No. 2; Apr. 1994; pp. 680–689.

T. Takagi, et al.; *A New Algorithm of an Accurate Fault Location For EHV/UHV Transmission Lines: Part I–Fourier Transformation Method*; IEEE Transactions on Power Apparatus and Systems, vol. PAS–100, No. 3; Mar. 1981; pp. 1316–1323.

M.S. Sachdev, et al.; *A Technique for Estimating Transmission Line Fault Locations From Digital Impedance Relay Measurements*; IEEE Transactions on Power Delivery, vol. 3, No. 1; Jan. 1988; pp. 121–129.

* cited by examiner

*Primary Examiner*—N. Le
*Assistant Examiner*—Vincent Q. Nguyen
(74) *Attorney, Agent, or Firm*—Jacobson Holman PLLC

(57) ABSTRACT

The present invention relates to a method for detecting a line-to-ground fault location in power network, and more particularly, detecting the line-to-ground fault location by direct 3-phase circuit analysis without using a symmetrical component transformation, so even in an unbalanced 3-phase circuit, the line-to-ground fault location can be accurately detected. In the method using direct 3-phase circuit analysis of this invention, inverse lemma is used to simplify matrix inversion calculations, thus the line-to-ground fault location can be easily and accurately determined even in the case of an unbalanced network without symmetrical component transformation.

4 Claims, 4 Drawing Sheets

METHOD FOR DETECTING LINE-TO-GROUND FAULT LOCATION IN POWER NETWORK

BACKGROUND OF THE INVENTION (a) Field of the invention

The present invention relates to a method for detecting a line-to-ground fault location in power network, and more particularly, detecting the line-to-ground fault location with direct 3-phase circuit analysis without using a symmetrical component transformation, whereby even in an unbalanced 3-phase circuit the line-to-ground fault location can be accurately detected.

b) Description of the Related Art

Rapid growth of economy has resulted in large scale of power systems, and an excessive increase in transmission and distribution networks of electric power systems causes many kinds of faults by various causes. Transmission and distribution networks of electric power systems are playing very important roles as the links between the power suppliers and the consumers. However, because most of lines are exposed to air, lightning, contact of animals or malfunctioning of protection devices causes many kinds of faults. When a line-to-ground fault occurs, detecting a fault location rapidly and precisely separating the part of the network including the fault location from the rest part of the network until repairing the fault being finished is very important to minimize power interruption rate and to provide highly reliable power supplying service and electric power of high quality.

Transformation of 3-phase networks to symmetrical component systems (symmetrical component transformation) is generally used in conventional methods for detecting the line-to-ground fault locations. A 3-phase balanced network can be transformed to a symmetrical component system, which has no coupling between sequences so that the systems of equation may be solved easily. In other words, diagonal sequence impedance matrices are obtained in case of the balanced networks, thus sequence voltage and current can be expressed without any coupling among the sequences ([1] G. B. Ancell, N. C. Pahalawaththa, "Maximum Likelyhood Estimation of Fault Location on Transmission Lines Using Travelling Waves", IEEE Transactions on PWRD, Vol. 9, No. 9, 1994, pp. 680–689; [2] T. Takagi, Y. Yamakoshi, J. Baba, K. Uemura, T. Sakaguchi, "A New Algorithm of an Accurate Fault Location for EHV/UHV Transmission Lines: Part—Fourier Transform Method", IEEE Trans. on PAS, Vol. PAS-100, No. 3, 1988, pp. 1316–1323; and [3] M. S. Sachdev, R. Agarwal, "A Technique For Estimating Transmission Line Fault Locations form Digital Impedance Relay Measurements", IEEE Trans. on PWRD, Vol. 3, No.1, 1988, pp 121–129).

Following is a detailed description of an example of the conventional method for detecting the line to ground fault location in a power system using the symmetrical component transformation. FIG. 1 shows a simplified diagram of a balanced 3-phase power network.

Assuming the capacitance in this network is so small that it is negligible, A-phase voltage at the measuring point (relay) is given as:

$$V_{Sa}=(1-d)Zl_1 \times (I_{Sa}+kI_{S0})+I_f R_f \qquad (1)$$

where, $V_{Sa}$: a-phase voltage; $I_{Sa}$: a-phase current; $I_{S0}$: zero sequence current; $Zl_0, Z_l$: zero and positive sequence impedance of line; $k=(Zl_0-Zl_1)/Zl_1$; $I_f$: fault current; $R_f$: fault resistance; and d: fault distance from the other end.

In equation (1), all the impedances except fault resistance are known values. In addition, the phase voltage and current are also available from measurement. One of two unknown variables, a fault current can be obtained using the current distribution factor and another one, a fault resistance can be eliminated during derivation of fault location equation, whose details are described in the following.

For a single line-to-ground fault, the following relation holds: $I_f=3I_{f2}$, and the negative sequence component of the fault current $I_{f2}$ can be obtained from the distribution factor, $D_f=I_{f2}/I_{S2}$ and the negative sequence current ($I_{S2}$) at the measuring point.

FIG. 2 is a negative sequence network obtained by symmetrical component transformation of a faulted network given in FIG. 1.

The negative sequence circuit for the balanced system in FIG. 2 is shown in FIG. 3. Applying KVL to the route A, the following voltage equation is obtained:

$$Z_{S2}I_{S2}+(1-d)Zl_2 I_{S2}-dZl_2 I_{r2}-Z_{r2}I_{r2}=0 \qquad (2)$$

where, $Z_{S2}, Z_{r2}$: equivalent negative sequence impedances for the source and load; $I_{S2}, I_{r2}$: negative sequence current flowing into the fault from the source and load side; and $Zl_2$: negative sequence line impedance.

From Equation (2), distribution factor $D_b$ can be obtained.

$$D_b = \frac{I_{r2}}{I_{S2}} = \frac{(1-d)Zl_2 + Z_{S2}}{dZl_2 + Z_{r2}} = \frac{-dA_1 + B_1}{dA_1 + D_1} \qquad (3)$$

where, $A_1=Zl_2$, $B_1=Z_{S2}+Zl_2$ and $D_1=Z_{r2}$.

Then a negative sequence current distribution factor $D_f$ is obtained using Eq. (3):

$$D_f = \frac{I_{f2}}{I_{S2}} = \frac{I_{S2}+I_{r2}}{I_{S2}} = \frac{B_1+D_1}{dA_1+D_1} \qquad (4)$$

Equation (4) provides a way to obtain negative sequence component of the fault current from the source current.

Substituting $I_f$ in Equation (1) by $I_f=3I_{f2}$ and Equation (4), we obtain:

$$V_{Sa} = (1-d)Zl_1 \times (I_{Sa}+kI_{S0})+3I_{f2}R_f \qquad (5)$$

$$= (1-d)Zl_1 \times (I_{Sa}+kI_{S0})+\frac{3(B_1+D_1)I_{S2}}{dA_1+D_1}R_f.$$

Rearrangement of Equation (5) yields:

$$(V_{Sa}-(1-d)Zl_1(I_{Sa}+kI_{S0}))(dA_1+D_1)+3(B_1 D_1)I_{S2}R_f=0 \qquad (6)$$

Equation (6) is rearranged again to form a second order polynomial with respect to fault distance variable d as follows:

$$d^2(a_r+ja_i)+d(b_r+jb_i)+(c_r jc_1)+R_f(d_r+jd_1)=0 \qquad (7)$$

where, $a_r+ja_i=(I_{Sa}+kI_{S0})Zl_1 A_1$, $b_r+jb_i=(I_{Sa}+kI_{S0})Zl_1 D_1+(V_{Sa}-((I_{Sa}+kI_{S0})Zl_1))A_1$, $c_r+jc_i=(V_{Sa}+kI_{S0})Zl_1))D_1$, $d_r+jd_i=3(B_1+D_1)I_{S2}$.

From the imaginary part of Equation (7), the fault resistance is obtained.

$$-(d^2 a_i+db_i c_i)/d_i=R_f \qquad (8)$$

Replacing $R_f$ in the real part of Equation (7) by Equation (8), $$d^2\left(a_r - \frac{d_r}{d_1}a_1\right) + d\left(b_r - \frac{d_r}{d_1}b_1\right) + c_r - \frac{d_r}{d_1}c_1 = 0 \quad (8\text{-}1)$$

is obtained. Then the fault distance 1−d can be obtained by solving Equation (8-1).

The advantage of the above method is that it can be easily applied to a balanced network. Zero sequence, positive sequence and negative sequence can be easily analyzed because they are not correlated, that is, there is no couplings, or equivalently, mutual impedances among the sequences. In the above example, the fault location can be simply determined by analyzing the negative sequence circuit only.

However, the above conventional method can only be applied to a balanced network, because the simplified equations of zero sequence, positive sequence and negative sequence, which are not correlated, can be obtained by symmetrical component transformation only in the balanced network. Thus, the conventional method is not available for unbalanced systems.

SUMMARY OF THE INVENTION

The present invention has been made in an effort to solve the above problems.

It is an object of the present invention to provide a method for detecting a line-to-ground fault location in a power network including a fault resistance, not using the symmetrical component transformation but using direct 3-phase circuit analysis. The line-to-ground fault location detecting method of the present invention requires voltage and current of a fundamental frequency measured at a relay.

In the method using direct 3-phase circuit analysis of the present invention, matrix inverse lemma is applied to simplify matrix inversion calculations, thus the line-to-ground fault location can be easily and accurately determined even in the case of an unbalanced network without using the symmetrical component transformation.

By using the method of the present invention, the line-to-ground fault location can be directly analyzed whether the 3-phase network is balanced or unbalanced.

To achieve the above object, the present invention provides a method for detecting a line-to-ground fault location in a power network comprising the steps of:

determining elements of a line impedance matrix and phase voltage and current at a relay;

determining a line-to-ground fault distance by substituting said elements of line impedance matrix, said phase voltage and current into a fault location equation based on direct circuit analysis;

wherein said fault location equation is derived from a model consisting of said phase voltage and current at the relay, a fault current, a fault resistance and the line-to-ground fault distance;

wherein the model is described by the equation: $V_{Sabc} = (1-d) \times Zl_{abc} \times I_{Sabc} + V_{fabc}$, where, $V_{Sabc} = [V_{sa} V_{sb} V_{sc}]'$: phase voltage vector, $I_{Sabc} = [I_{Sa} I_{Sb} I_{Sc}]'$: phase current vector, $V_{fabc} = [V_{fa} V_{fb} V_{fc}]'$: phase voltage vector at the fault location, $$Zl_{abc} = \begin{bmatrix} Zl_{aa} & Zl_{ab} & Zl_{ac} \\ Zl_{ba} & Zl_{bb} & Zl_{bc} \\ Zl_{ca} & Zl_{cb} & Zl_{cc} \end{bmatrix}: \text{line impedance matrix,}$$

$I_f$: fault current, 1−d: fault distance;

wherein said fault location equation is derived by using the matrix inverse lemma: $(A^{-1}+BCD)^{-1} = A - AB(C^{-1}+DAB)^{-1}DA$, to simplify an inverse matrix calculation; and wherein the fault location equation is derived by direct circuit analysis without using the conventional symmetrical component transformation method.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiments of the present invention will now be described in detail, with reference to the accompanying drawings.

Figure 1:
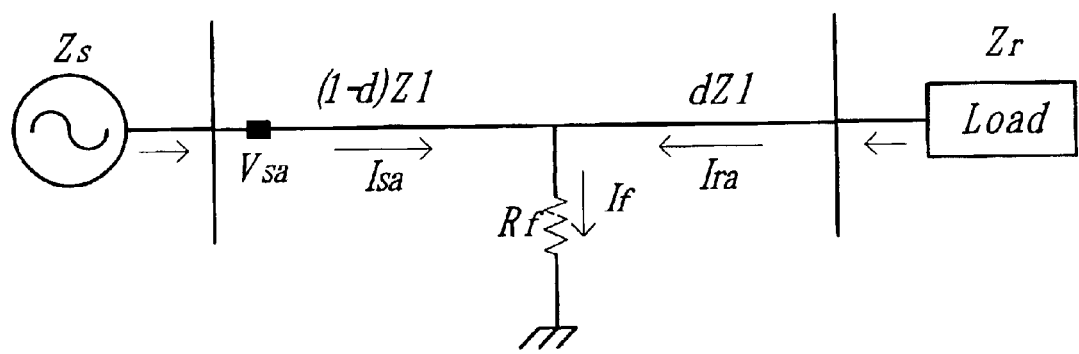
FIG. 1 shows a simplified diagram of a balanced 3-phase power network.
Figure 2:
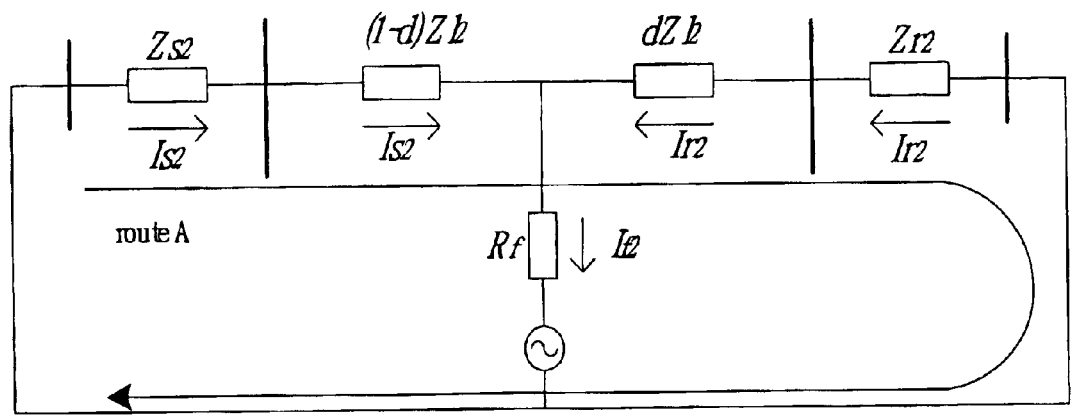
FIG. 2 is a negative sequence network obtained by symmetrical component transformation of a faulted network.
Figure 3:
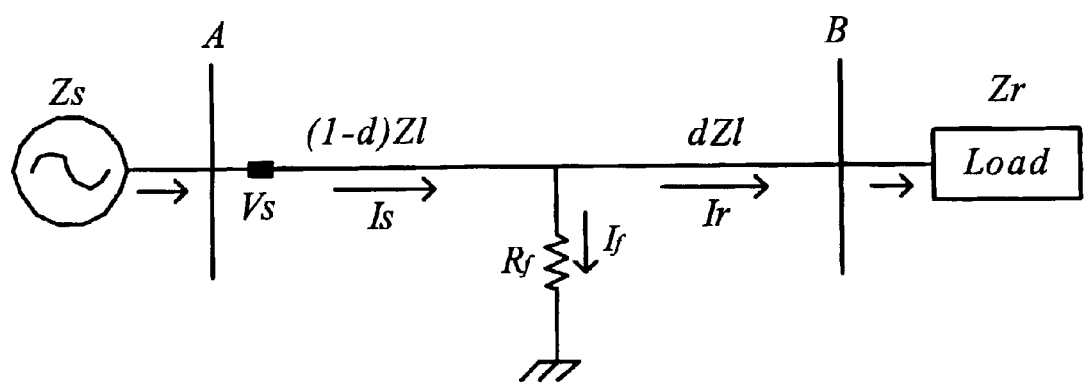
FIG. 3 shows a simple diagram of one-line-to-ground fault occurred in a general 3-phase power network whether it is balanced or unbalanced one.

FIG. 3 shows general 3-phase transmission and distribution of simplified diagram of faulted network whether they are operated in a balance or unbalance manner. The proposed algorithm use voltage and current measured at a relay.

Assuming the capacitance of lines negligible, voltage and current at relay satisfy the following relation.

$$V_{Sabc} = (1-d) \times Zl_{abc} \times IS_{abc} + [I_f R_f, V_b', V_c']' \quad (9)$$

where, $V_{Sabc} = [V_{Sa} V_{Sb} V_{Sc}]'$:phase voltage vector at relay (phase a, b and c); $I_{Sabc} = [I_{Sa} I_{Sb} I_{Sc}]'$: phase current vector at relay;

$$Zr_{abc} = \begin{bmatrix} Zr_{aa} & Zr_{ab} & Zr_{ac} \\ Zr_{ba} & Zr_{bb} & Zr_{bc} \\ Zr_{ca} & Zr_{cb} & Zr_{cc} \end{bmatrix}: \text{load impedance;}$$

$I_f$: fault current; $R_f$: fault resistance; d: fault distance: and $V_b'$ and $V_c'$: b and c phase voltage which are normal on the fault location. e In equation (9), the line impedance is given, and the phase voltage and current at relay can be measured. However, the fault current $I_f$ and fault resistance $R_f$ are unknown. They can be obtained using the direct 3-phase circuit analysis of this invention as described below.

The voltage of a phase at relay, when line-to-ground fault takes place, can be expressed as follows.:

$$V_{Sa} = (1-d)(Zl_{aa}I_{Sa} + Zl_{ab}I_{Sb} + Zl_{ac}I_{Sc}) + I_f R_f \quad (10)$$

The fault current $I_f$ can be represented as a function of the phase current at the relay using current distribution law of a parallel admittance network:

$$\begin{bmatrix} I_f \\ 0 \\ 0 \end{bmatrix} = Y_f[Y_f + (dZl_{abc} + Zr_{abc})^{-1}]^{-1} \begin{bmatrix} I_{Sa} \\ I_{Sb} \\ I_{Sc} \end{bmatrix} \quad (11)$$

where, $$Y_f = \begin{bmatrix} 1/R_f & 0 & 0 \\ 0 & 0 & 0 \\ 0 & 0 & 0 \end{bmatrix} : \text{the fault admittance matrix at the fault location,}$$

$$Zr_{abc} = \begin{bmatrix} Zr_{aa} & Zr_{ab} & Zr_{ac} \\ Zr_{ba} & Zr_{bb} & Zr_{bc} \\ Zr_{ca} & Zr_{cb} & Zr_{cc} \end{bmatrix} : \text{load impedance matrix,}$$

The inverse matrix $[Y_f+(dZl_{abc}+Zr_{abc})^{-1}]^{-1}$ in Eq. (11) can be simplified by the matrix inverse lemma:

$$(A^{-1}+BCD)^{-1}=A-AB(C^{-1}+DAB)^{-1}DA \quad (12)$$

A, B, C and D are defined as follows:

$$A \equiv (dZL_{abc} + Zr_{abc}) = \begin{bmatrix} dZl_{aa} + Zr_{aa} & dZl_{ab} + Zr_{ab} & dZl_{ac} + Zr_{ac} \\ dZl_{ba} + Zr_{ba} & dZl_{bb} + Zr_{bb} & dZl_{bc} + Zr_{bc} \\ dZl_{ca} + Zr_{ca} & dZl_{cb} + Zr_{cb} & dZl_{cc} + Zr_{cc} \end{bmatrix} \quad (13)$$

$$= \begin{bmatrix} a1 & a2 & a3 \\ a4 & a5 & a6 \\ a7 & a8 & a9 \end{bmatrix}$$

$$B \equiv \begin{bmatrix} 1 \\ 0 \\ 0 \end{bmatrix}, C \equiv 1/R_f, D \equiv [1 \ 0 \ 0]$$

Then, applying the lemma, we obtain:

$$[Yf + (dZl_{abc} + Zr_{abc})^{-1}]^{-1} = \quad (14)$$

$$\begin{bmatrix} a1 & a2 & a3 \\ a4 & a5 & a6 \\ a7 & a8 & a9 \end{bmatrix} - \begin{bmatrix} a1 \\ a4 \\ a7 \end{bmatrix} (R_f + a1)^{-1} [a1 \ a2 \ a3]$$

Then the fault current equation, Eq. (11) can be rewritten as:

$$\begin{bmatrix} I_f \\ 0 \\ 0 \end{bmatrix} = \frac{R_f}{R_f + a1} \begin{bmatrix} 1/R_f & 0 & 0 \\ 0 & 0 & 0 \\ 0 & 0 & 0 \end{bmatrix} \begin{bmatrix} a1 & a2 & a3 \\ xx & xx & xx \\ xx & xx & xx \end{bmatrix} \begin{bmatrix} I_{Sa} \\ I_{Sb} \\ I_{Sc} \end{bmatrix} \quad (15)$$

where, xx represents an element that we have no concern.
The final expression for the fault current becomes:

$$I_f = \quad (16)$$

$$\frac{1}{R_f + dZl_{aa}Zr_{aa}} \times [dZl_{aa} + Zr_{aa} \ dZl_{ab} + Zr_{ab} \ dZl_{ac} + Zr_{ac}] \begin{bmatrix} I_{Sa} \\ I_{Sb} \\ I_{Sc} \end{bmatrix}$$

Substitution of Eq. (16) into the fault current equation of Eq. (10) yields:

$$V_{Sa} = (1-d)(Zl_{aa}I_{Sa} + Zl_{ab}I_{Sb} + Zl_{ac}I_{Sc}) + \quad (17)$$

$$\frac{R_f}{R_f + dZl_{aa} + Zr_{aa}} \times [(dZl_{aa} + Zr_{aa})I_{Sa} +$$

$$(dZl_{ab} + Zr_{ab})I_{Sb} + (dZl_{ac} + Zr_{ac})I_{Sc}]$$

or $(V_{Sa}-(1-d)C_1(R_f+dZl_{aa}+Zr_{aa})-R_f(dC_1+C_2)=0 \quad (18)$ where, $C_1=Zl_{aa}I_{Sa}+Zl_{ab}I_{Sb}+Zl_{ac}I_{Sc}$, $C_2=Zr_{aa}I_{Sa}+Zr_{ab}I_{Sb}+Zr_{ac}I_{Sc}$.

Eq. (18) can be rearranged as a second order polynomial with respect to the distance variable d:

$$d^2C_1Zl_{aa}+d(V_{Sa}Zl_{aa}-C_1Zl_{aa}C_1Zr_{aa})+Zr_{aa}(V_{Sa}-C_1)+R_f(V_{Sa}-C_1-C_2)=0 \quad (19)$$

Expressing the coefficients of Eq. (19) by the complex number represented in the rectangular form, i.e., $a_r+ja_1=C_1Zl_{aa}$, $b_r+jb_1=V_{Sa}Zl_{aa}-C_1Zl_{aa}C_1Zr_{aa}$, $c_r+jc_i=Zr_{aa}(V_{Sa}-C_1)$, $d_r+jd_i=Vs_a-C_1-C_2$.

Eq. (19) becomes:

$$d^2(a_r+ja_i)+d(b_r+jb_i)+c_r+jc_i+R_f(d_r+jd_i)=0 \quad (20)$$

Hence, its imaginary part gives:

$$-(d^2a_i+db_i+c_i)/d_i=R_f \quad (21)$$

From its real part, a quadratic polynomial with respect to d is derived by use of Eq. (21) as follows:

$$d^2\left(a_r - \frac{d_r}{d_i}a_i\right) + d\left(b_r - \frac{d_r}{d_i}b_i\right) + c_r - \frac{d_r}{d_i}c_i = 0 \quad (22)$$

Finally the fault distance (1−d) can be obtained by solving Eq. (22). Note that this fault location equation based on the direct circuit analysis can be applied to any system-balanced or unbalanced, three phase or three/single phase systems.

Figure 4:
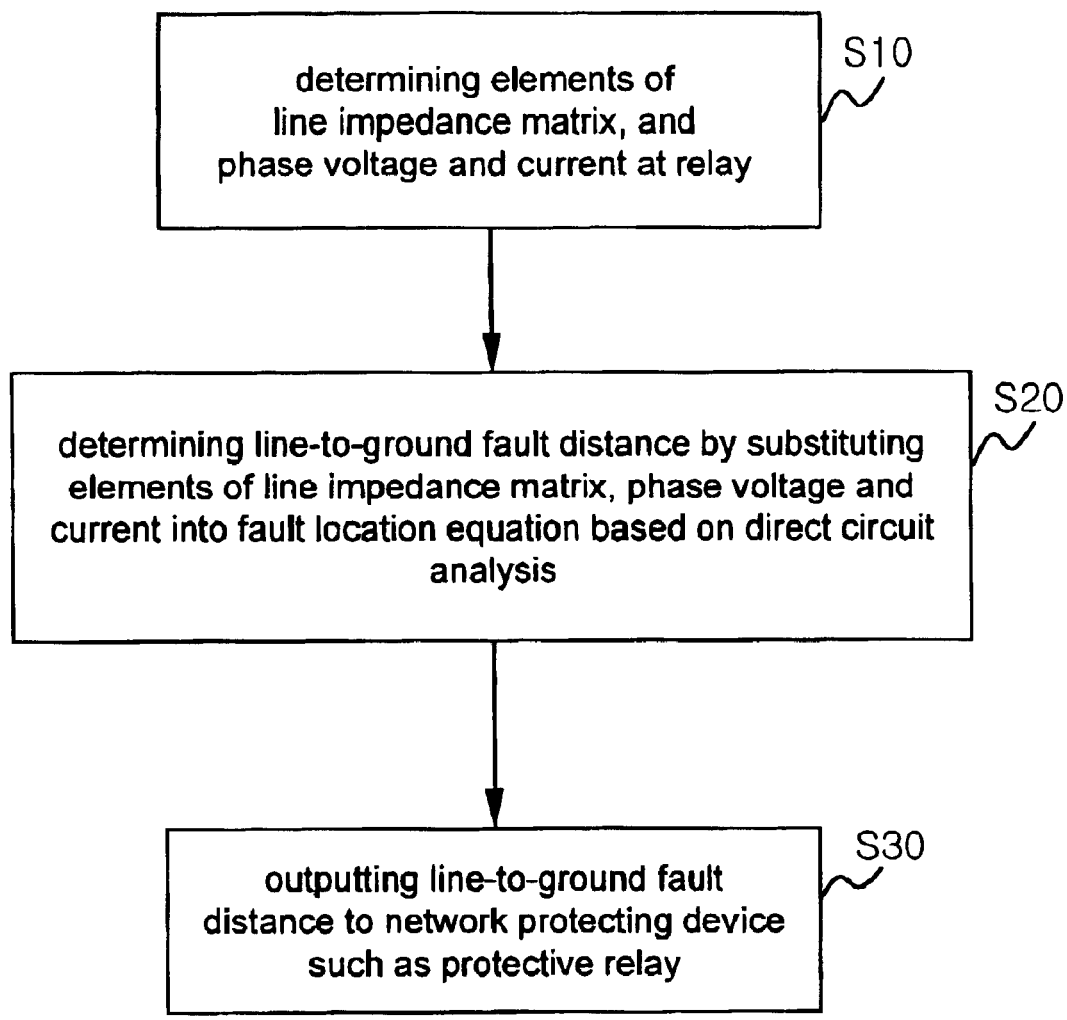
FIG. 4 shows a flow of a preferred embodiment of the present invention.

FIG. 4 shows a flow chart of the preferred embodiment of this invention.

The preferred embodiment shown in FIG. 4 comprises the steps of: determining elements of a line impedance matrix and phase voltage and current at a relay (step S10); determining a line-to-ground fault distance by substituting said elements of line impedance matrix, said phase voltage and current into a fault location equation based on direct circuit analysis (step S20); and outputting the line-to-ground fault distance to the network protecting device such as protective relays (step S30).

In the method of the present invention as described above, by using direct 3-phase circuit analysis, it is possible to detect a line-to-ground fault location in a power network including a fault resistance without using the symmetrical component transformation.

The line-to-ground fault location detecting method of the present invention requires voltage and current of a fundamental frequency measured at a relay.

In the method using direct 3-phase circuit analysis of this invention, inverse lemma is used to simplify matrix operations, thus the line-to-ground fault location can be easily and accurately determined even in the case of an unbalanced network without symmetrical component transformation.

By using the method of the present invention, the line-to-ground fault location can be directly analyzed whether the 3-phase network is balanced or unbalanced.

The objective of the embodiments and drawings is to clearly explain the present invention and does not limit the technical scope of the invention. The present invention described above can be replaced, modified and changed by one skilled in the art, as long as such changes do not exceed the technical scope of the invention. It is, therefore, to be understood that the appended claims are intended to cover all such modifications and changes as fall within the true spirit of the invention.

What is claimed is:

1. A method for detecting a line-to-ground fault location in a power network comprising the steps of:

determining elements of a line impedance matrix and phase voltage and current at a relay;

determining a line-to-ground fault distance by substituting said elements of line impedance matrix, said phase voltage and current into a fault location equation based on direct circuit analysis;

wherein said fault location equation is derived from a model consisting of said phase voltage and current at the relay, a fault current, a fault resistance and the line-to-ground fault distance;

wherein the model is described by the equation: $V_{Sab} = (1-d) \times Zl_{abc} \times I_{Sabc} + V_{fabc}$, where, $V_{Sabc} = [V_{Sa} V_{Sb} V_{Sc}]'$: phase voltage vector, $I_{Sabc} = [I_{Sa} I_{Sb} I_{Sc}]'$: phase current vector, $V_{fabc} = [V_{fa} V_{fb} V_{fc}]'$: phase voltage vector at the fault location, $$Zl_{abc} = \begin{bmatrix} Zl_{aa} & Zl_{ab} & Zl_{ac} \\ Zl_{ba} & Zl_{bb} & Zl_{bc} \\ Zl_{ca} & Zl_{cb} & Zl_{cc} \end{bmatrix}: \text{line impedance matrix,}$$

$I_f$: fault current, 1–d: fault distance;

wherein said fault location equation is derived by using the matrix inverse lemma: $(A^{-1}+BCD)^{-1} = A - AB(C^{-1}+DAB)^{-1}DA$, to simplify an inverse matrix calculation; and wherein the fault location equation is derived by direct circuit analysis without using the conventional symmetrical component transformation method.

2. The method of claim 1, wherein the power network is a 3-phase balanced network.

3. The method of claim 1, wherein the power network is a 3-phase unbalanced network.

4. The method of claim 1, wherein the fault location equation is derived by steps of:

(a) expressing the phase voltage of the a-phase which has the fault as follows:

$$V_{Sa} = (1-d)(Zl_{aa}I_{Sa} + Zl_{ab}I_{Sb} + Zl_{ac}I_{Sc}) + I_f R_f;$$

(b) expressing the fault current $I_f$ in terms of the phase current $I_s$ by using current distribution law of a parallel network yielding:

$$\begin{bmatrix} I_f \\ 0 \\ 0 \end{bmatrix} = Y_f [Y_f + (dZl_{abc} + Zr_{abc})^{-1}]^{-1} \begin{bmatrix} I_{Sa} \\ I_{Sb} \\ I_{Sc} \end{bmatrix},$$

where $$Y_f = \begin{bmatrix} 1/R_f & 0 & 0 \\ 0 & 0 & 0 \\ 0 & 0 & 0 \end{bmatrix}: \text{fault admittance matrix}$$

and $$Zr_{abc} = \begin{bmatrix} Zr_{aa} & Zr_{ab} & Zr_{ac} \\ Zr_{ba} & Zr_{bb} & Zr_{bc} \\ Zr_{ca} & Zr_{cb} & Zr_{cc} \end{bmatrix}: \text{load impedance matrix;}$$

(c) simplifying the equation of step (b) by using the inverse matrix lemma and substituting the simplified equation into the a-phase equation of step (a); and (d) deriving a set of equations from a real and an imaginary part of the equation obtained at step (c);

(e) deriving a second order polynomial equation by combining the set of equations obtained at step (d); and (f) deriving the fault location equation by solving the second order polynomial equation.

* * * * *